(12) United States Patent
Pu et al.

(10) Patent No.: US 12,113,053 B2
(45) Date of Patent: Oct. 8, 2024

(54) LED CHIP TRANSFER METHOD AND DISPLAY PANEL

(71) Applicant: HKC CORPORATION LIMITED, Shenzhen (CN)

(72) Inventors: Yang Pu, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/330,332

(22) Filed: Jun. 6, 2023

(65) Prior Publication Data
US 2024/0113083 A1    Apr. 4, 2024

(30) Foreign Application Priority Data
Sep. 29, 2022 (CN) .......................... 202211197908.7

(51) Int. Cl.
*H01L 29/20* (2006.01)
*H01L 25/075* (2006.01)
(Continued)

(52) U.S. Cl.
CPC .......... *H01L 25/0753* (2013.01); *H01L 33/62* (2013.01); *H01L 2933/0066* (2013.01)

(58) Field of Classification Search
CPC ................ H01L 25/0753; H01L 33/62; H01L 2933/0066
See application file for complete search history.

(56) References Cited

U.S. PATENT DOCUMENTS 6,507,095 B1 *  1/2003  Hashimoto .......... H01L 21/4853
                                                      257/676
11,901,486 B2 *  2/2024  Chen .................... H01L 33/005
(Continued)

FOREIGN PATENT DOCUMENTS

CN    109786421    5/2019
CN    110544704    12/2019
(Continued)

OTHER PUBLICATIONS

CNIPA, Notification to Grant Patent Right for Invention for CN Application No. 202211197908.7, Nov. 14, 2022.
(Continued)

*Primary Examiner* — Ismail A Muse
(74) *Attorney, Agent, or Firm* — Hodgson Russ LLP

(57) ABSTRACT

A LED chip transfer method comprises: providing a driving substrate having at least one set of binding points, the set of binding points comprising a first and second binding points; forming a compensation layer covering the first and second binding points; providing a chip substrate comprising a substrate and chips; performing a first alignment treatment to form a first groove and a second groove on the compensation layer; forming a first and second via holes spaced from each other by the first groove and the second groove, forming a first transfer electrode and a second transfer electrode disconnected from each other on the compensation layer, inserting the first pin and the second groove into the first groove and the second groove to bind with the first transfer electrode and the second transfer electrode; and stripping the substrate from the chip.

18 Claims, 4 Drawing Sheets

(51) Int. Cl.
H01L 33/00 (2010.01)
H01L 33/62 (2010.01)

(56) References Cited

U.S. PATENT DOCUMENTS

| | | | |
|---|---|---|---|
| 2013/0134436 A1 | 5/2013 | Pham et al. | |
| 2018/0342691 A1 | 11/2018 | Lu | |
| 2021/0111168 A1* | 4/2021 | Jung | H01L 33/62 |
| 2021/0376207 A1* | 12/2021 | Meitl | H05B 45/20 |
| 2023/0317900 A1* | 10/2023 | Leber | H01L 33/62 |
| | | | 257/79 |

FOREIGN PATENT DOCUMENTS

| | | |
|---|---|---|
| CN | 110690247 | 1/2020 |
| CN | 111900154 | 11/2020 |
| CN | 114005848 | 2/2022 |
| CN | 114823996 | 7/2022 |
| CN | 114864439 | 8/2022 |
| CN | 115295706 | 11/2022 |
| JP | 2002368017 | 12/2002 |
| WO | 2021108951 | 6/2021 |

OTHER PUBLICATIONS

WIPO, International Search Report for PCT/CN2023/097427, Aug. 17, 2023.

\* cited by examiner

LED CHIP TRANSFER METHOD AND DISPLAY PANEL

CROSS-REFERENCE TO RELATED APPLICATIONS

This application claims priority to Chinese Patent Application No. 202211197908.7, filed Sep. 29, 2022, the entire contents of which are incorporated herein by reference.

TECHNOLOGY FIELD

The disclosure relates to the field of display technology, and more particularly, to an LED chip transfer method and a display panel.

BACKGROUND

Micro-LED is a new generation of display technology. Compared with the existing liquid crystal display, Micro-LED has higher photoelectric efficiency, higher brightness, higher contrast and lower power consumption, and can be combined with flexible panel to achieve flexible display.

Miniature Light Emitting Diode (Micro-LED) chips are light-emitting diode chips with a size of less than 100 microns. Usually, after the fabrication of Micro-LED chips, a huge amount of transfer process is needed, specifically, a large number of Micro-LED chips (usually tens of thousands to hundreds of thousands) need to be transferred to the driving circuit board. However, there is an inclination problem of the current micro light-emitting diode chip, resulting in an abnormal binding between the Micro-LED chip and the driving substrate.

SUMMARY

There are provided an LED chip transfer method and a display panel according to embodiments of this disclosure. The technical solution is as below:

According to a first aspect of the present disclosure, there is provided an LED chip transfer method, which includes:
  providing a driving substrate having at least one set of binding points, the set of binding points comprising a first binding point and a second binding point;
  forming a compensation layer covering the first binding point and the second binding point on the driving substrate;
  providing a chip substrate comprising a substrate and a plurality of chips, each of the plurality of chips comprising a chip body, a first pin and a second pin, the first pin and the second pin being disposed on a side of the chip body away from the substrate; performing first alignment processing between the chip substrate and the driving substrate, forming a first groove on the compensation layer by using the first pin, and forming a second groove on the compensation layer by using the second pin, the second groove being spaced from the first groove;
  patterning the compensation layer after the first groove and the second groove are formed on the compensation layer, forming a first via hole and a second via hole spaced from each other by the first groove and the second groove on the compensation layer, the first via hole exposing at least a portion of the first binding point, and the second via hole exposing at least a portion of the second binding point;
  forming a first transfer electrode and a second transfer electrode disconnected from each other on the compensation layer, the first transfer electrode having a portion located in the first groove and a portion overlapped with the first binding point through the first via hole, the second transfer electrode having a portion located in the second groove and a portion overlapped with the second binding point through the second via hole;
  performing a second alignment process between the chip substrate and the driving substrate, so that the first pin is inserted into the first groove and bound with the first transfer electrode, and the second pin is inserted into the second groove and bound with the second transfer electrode; and
  stripping the substrate from the chip after the second alignment process is performed between the chip substrate and the driving substrate.

According to a second aspect of the present disclosure, there is provided a display panel, which includes:
  a driving substrate having at least one set of binding points, the set of binding points comprising a first binding point and a second binding point;
  a chip comprising a chip body, a first pin and a second pin, the first pin and the second pin being connected to the chip body and arranged at intervals;
  a compensation layer arranged on the driving substrate and covering the first binding point and the second binding point, the compensation layer being provided with a first groove and a second groove arranged at intervals;
  a first transfer electrode, the first transfer electrode having a portion connected to the first binding point through a first via hole and a portion located in the first groove; and
  a second transfer electrode arranged on the compensation layer and spaced from the first transfer electrode, the second transfer electrode being connected to the second binding point through a second via hole, and a portion of the second transfer electrode being located in the second groove.

It should be understood that the above general description and the following detailed description are exemplary and explanatory only and are not intended to limit the present disclosure.

BRIEF DESCRIPTION OF DRAWINGS

The accompanying drawings, which are incorporated in and constitute a part of the description, illustrate embodiments consistent with the present disclosure and, together with the description, serve to explain the principles of the present disclosure. Obviously, the drawings in the following description are merely some embodiments of the present disclosure, from which other drawings may be obtained without exerting inventive effort by those ordinarily skilled in the art.

DESCRIPTION OF THE EMBODIMENTS

Figure 1:
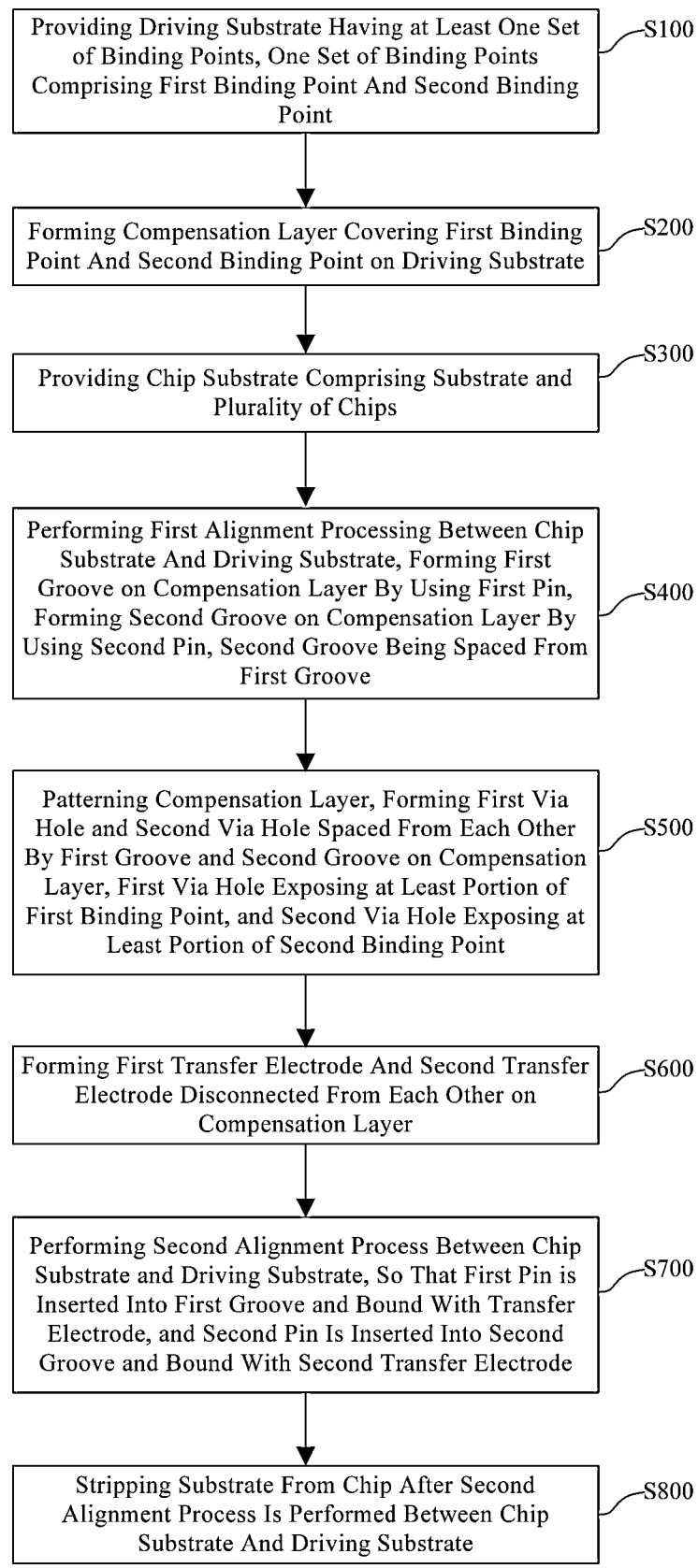
FIG. 1 shows a flow chart of an LED chip transfer method according to embodiment 1 of the present disclosure.

The exemplary embodiments will now be described more fully with reference to the accompanying drawings. However, the example embodiments can be implemented in a variety of forms and should not be construed as being limited to the examples set forth herein. Rather, these embodiments are provided so that the present disclosure will be more comprehensive and complete, and the concept of example embodiments will be fully communicated to those skilled in the art.

In the present disclosure, the terms "first" and "second" are for descriptive purposes only and cannot be construed as indicating or implying relative importance or implying the number of the indicated technical features. Thus, features defined with "first" and "second" may explicitly or implicitly include one or more of the features. In the description of the present disclosure, "multiple" means two or more unless otherwise expressly specified.

In the present disclosure, unless otherwise explicitly provided and limited, the terms such as "mount," and "connect," should be understood broadly, which, for example, may refer to a fixed connection, a detachable connection, or an integral connection; which may refer to a mechanical connection or an electrical connection; which may refer to a direct connection or an indirect connection via an intermediate medium; which may also refer to a communication between the insides of two elements. For those ordinarily skilled in the art, the specific meanings of the above terms in the present disclosure will be understood according to the specific circumstances.

Further, the described features, structures, or characteristics may be incorporated in any suitable manner in one or more embodiments. In the following description, many specific details are provided to give a full understanding of the embodiments of the present disclosure. However, those skilled in the art will appreciate that the technical aspects of the present disclosure may be practiced without one or more of the specific details, or other methods, components, devices, steps and the like may be employed. In other instances, the common methods, devices, implementations or operations are not shown or described in detail to avoid obscuring aspects of the present disclosure.

Embodiment 1

In the mass transfer process of the LED chip 30, since the side of the substrate at which the LED chip 30 is attached is made of a weak adhesive material, when the LED chip adheres to the substrate, the side of the substrate close to the LED chip 30 is easy to deform and adheres to the LED chip 30. In the process of adhesion of the LED chip 30 to the substrate, since the pressures applied to the substrate are different, the contact positions of each LED chip 30 with the substrate are different, and some LED chips 30 are pressed deeply, some LED chips 30 are pressed shallowly, and some LED chips 30 may be inclined. Thus, when the LED chips 30 are bound to the driving substrate 10, the LED chips 30 are not at the same level so that the pins of some LED chips 30 cannot be effectively bound to the binding points on the driving substrate 10, these LED chips 30 cannot be separated from the chip substrate, resulting in transfer failure; or due to the abnormal contact between the binding pin and the binding point when being bounded to the driving substrate 10, which causes the LED chip 30 to emit light abnormally.

Figure 2:
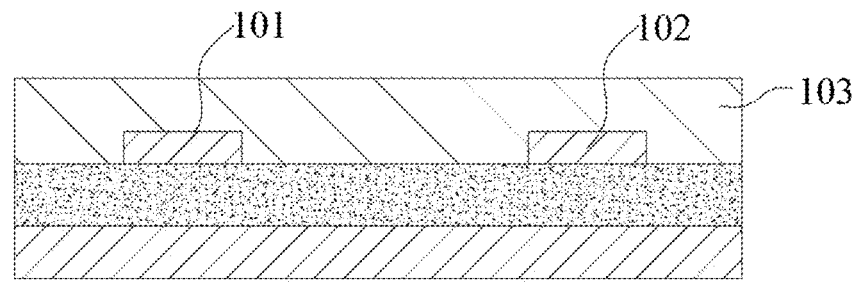
FIG. 2 shows a structural schematic diagram of adding a compensation layer on a driving substrate according to embodiment 1 of the present disclosure.

Therefore, in order to solve the problem of transfer failure of the LED chips 30, the embodiment of the present disclosure provides an LED chip 30 transfer method, as shown in FIG. 1, it includes the following steps:

S100, as shown in FIG. 2, a driving substrate 10 is provided, the driving substrate 10 has at least one set of binding points, the set of the binding point includes a first binding point 101 and a second binding point 102.

For example, the transistor in the driving substrate 10 may be Amorphous Silicon (A-Si), Low Temperature Poly-silicon (LTPS), Indium Gallium Zinc Oxide (IGZO), monocrystalline silicon MOS, or the like. The amorphous silicon has low quality and low carrier mobility, so amorphous silicon transistors can bear low current density, while low-temperature polysilicon and indium gallium zinc oxide have high carrier mobility and can bear large current density.

The first binding point 101 may be a drain of the transistor or the MOS transistor on the driving substrate 10. The second binding point 102 may be a common signal trace on the driving substrate 10. The first binding point 101 may provide a positive voltage for the LED chip 30, the second binding point 102 may provide a negative voltage, and the first binding point 101 and the second binding point 102 are arranged in the same layer.

It should be understood that, "arranged in the same layer" refers to a layer structure in which a layer for forming a specific pattern is formed by the same film forming process and then formed by one patterning process using the same mask. That is, the one patterning process corresponds to a mask. Depending on the specific graphics, one patterning process may include multiple exposure, development, or etching processes, and the specific patterns in the formed layer structure may be continuous or discontinuous, and these specific patterns may also be at different heights or have different thicknesses, thus simplifying the manufacturing process, saving manufacturing costs and improving production efficiency.

Step S200, referring to FIG. 2, a compensation layer 103 covering the first binding point 101 and the second binding point 102 is formed on the driving substrate 10.

Figure 3:
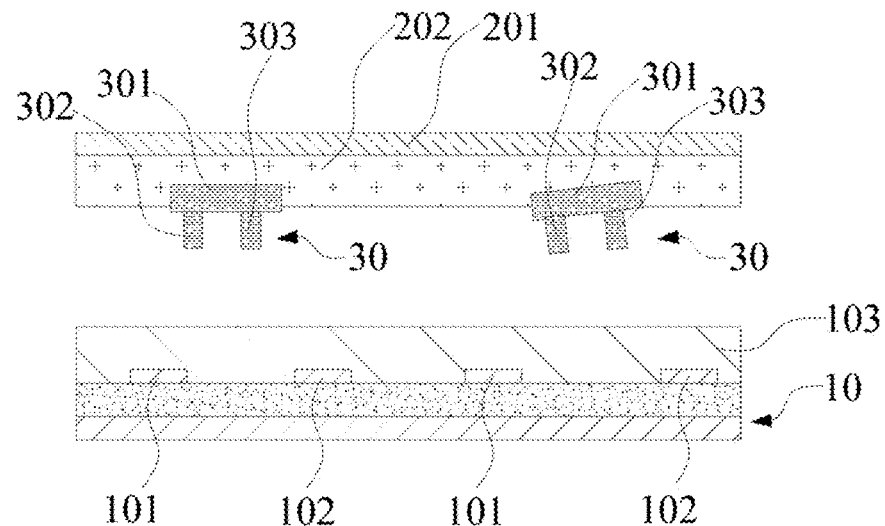
FIG. 3 shows structural schematic diagrams of a chip substrate with a chip and the driving substrate according to embodiment 1 of the present disclosure.

Step S300, as shown in FIG. 3, a chip substrate is provided, the chip substrate includes a substrate 201 and a plurality of LED chips 30. The LED chip 30 includes a chip body 301, a first pin 302 and a second pin 303, the first pin 302 and the second pin 303 are disposed on a side of the chip body 301 away from the substrate 201.

It should be noted that the chip substrate can be a substrate structure formed by direct growth on a wafer, or it can be a substrate structure to which the LED chip 30 is transferred to the driving substrate 10 by adhering the LED chip 30 after being grown on the wafer.

Further, for a growth substrate transferred by means of transferring, the growth substrate includes a substrate 201 and a transfer layer 202. The transfer layer 202 is disposed on one side of the substrate 201 and connected to the chip body 301. The substrate 201 may be made of plexiglass, resin, quartz, or sapphire and the material thereof is not specifically limited. The transfer layer 202 may be made of a weakly adhesive material such as Polydimethylsiloxane (PDMS) or the like.

Figure 4:
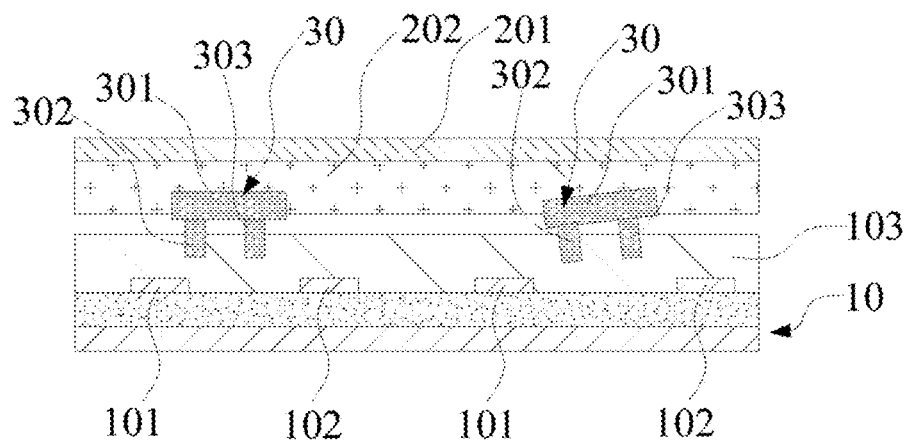
FIG. 4 shows a structural schematic diagram of the chip inserted in a compensation layer according to embodiment 1 of the present disclosure.

In step S400, as shown in FIG. 4, the chip substrate and the driving substrate 10 are aligned for the first time, and a first groove 103a is formed on the compensation layer 103 by the first pin 302, and a second groove 103b is formed on the compensation layer 103 by the second pin 303. The second groove 103b and the first groove 103a are spaced from each other.

It should be noted that the size of the chip substrate and the driving substrate 10 can be the same, so that the LED chip 30 can be transferred more conveniently and quickly. In addition, the number of grooves corresponds one-to-one with the pins of the LED chips 30 on the chip substrate.

Next, after the first alignment treatment, an external pressure toward the driving substrate 10 is applied to the chip substrate to press at least a portion of the first pin 302 and the second pin 303 into the compensation layer 103 to form the first groove 103a and the second groove 103b on the compensation layer 103 having the same profiles as the first pin 302 and the second pin 303. In this way, it is more advantageous to form the same profile as the pin of the LED chip 30 on the compensation layer 103 by laminating, which is more advantageous to the connection between the LED chip 30 and the bonding point, and improves the transfer success rate of the LED chips 30.

Further, after applying an external pressure toward the driving substrate 10 to the chip substrate, a portion of each of the first pin 302 and the second pin 303 is pressed into the compensation layer 103, and the other portion protruded from the surface of the driving substrate 10 with respect to the compensation layer 103.

It should be noted that when the driving substrate 10 and the chip substrate are attached and pressed together, the first pin 302 and the second pin 303 are partially inserted into the compensation layer 103, so as to prevent the first pin 302 and the second pin 303 from being inserted too deeply to cause damage to the structure of the transistor, to prevent the operation state of the LED chip 30 from being affected, and to avoid that the LED chip 30 cannot be pulled out when the first pin and the second pin are inserted too deeply. If the first pin 302 and the second pin 303 are inserted too shallowly, the formation of the transfer electrode may fail, thus affecting the connection between the LED chip 30 and the binding point.

It is worth mentioning that the first pin 302 and the second pin 303 of the LED chip have the same pin height, i.e., they are located in the same horizontal plane.

In addition, the thickness of the compensation layer 103 is greater than the height of the pins of the LED chip 30; or the thickness of the compensation layer 103 is greater than the height of the entire LED chip 30. Thus, the LED chip 30 can be effectively protected and the LED chip 30 can be prevented from being inserted too deeply to cause damage to the transistor.

For example, the compensation layer 103 may be 2 to 4 µm, e.g., 2 µm, 3 µm, or 4 µm. It should be understood that if the compensation layer 103 is too thick, the cost is too high and it is not easy to define the first and second via holes 103c and 103d; and if the compensation layer is too thin, it is not easy to perform compensation and there is also the problem of pin piercing of the LED chip 30.

Figure 5:
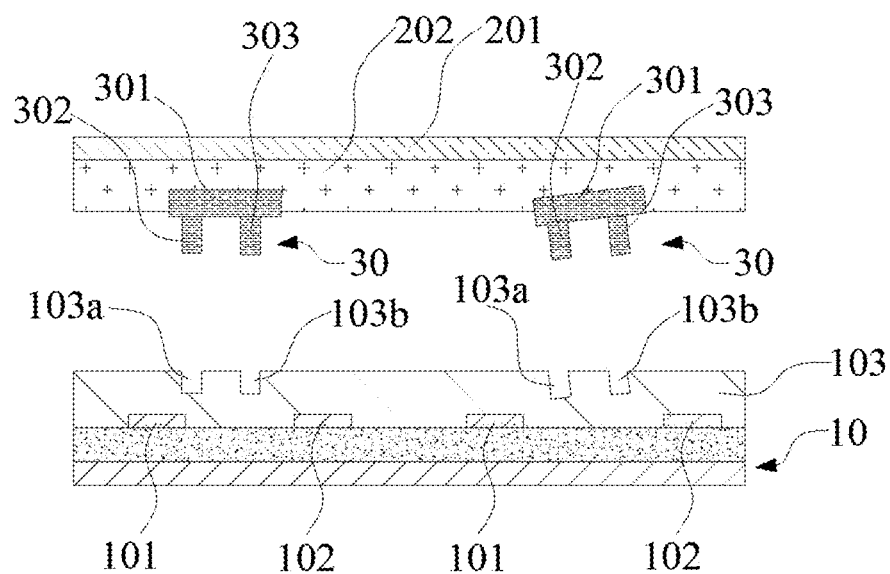
FIG. 5 shows a structural schematic diagram of removing the chip substrate and forming grooves according to embodiment 1 of the present disclosure.
Figure 6:
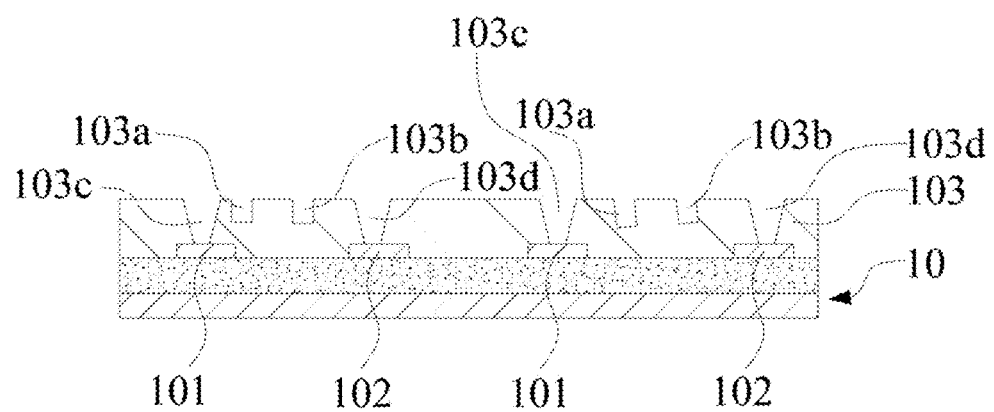
FIG. 6 shows a structural schematic diagram of adding a first via hole and a second via hole on the compensation layer according to embodiment 1 of the present disclosure.

Further, in step S500, referring to FIGS. 5 and 6, after the first groove 103a and the second groove 103b are formed on the compensation layer 103, the compensation layer 103 is patterned, and the first via hole 103c and the second via hole 103d spaced from each other by the first groove 103a and the second groove 103b are formed on the compensation layer 103. The first via hole 103c exposes at least a portion of the first binding point 101 and the second via hole 103d exposes at least a portion of the second binding point 102.

For example, the compensation layer 103 is exposed, developed, and etched to form the first via hole 103c and the second via hole 103d spaced from each other, and the first groove 103a and the second groove 103b are located between the first via hole 103c and the second via hole 103d. Thus, the design of the first groove 103a and the second groove 103b is more convenient, and which is conducive to providing the first via hole 103c and the second via hole 103d, so as to avoid interference between the two and influence on the transfer process of the LED chip 30.

It is worth mentioning that one LED chip 30 corresponds to one first via hole 103c and one second via hole 103d.

In addition, when the chip substrate is separated, the LED chip 30 is not bound to the first binding point 101 and the second binding point 102 on the driving substrate 10, and the friction force between the groove and pins of the LED chips 30 is smaller than the adhesion force between the transfer layer 202 and the LED chip 30. In this way, pins of the LED chip can be disengaged from the grooves in the compensation layer 103 so as to disengage the LED chip 30 from the grooves, which facilitates the subsequent formation of the transfer electrodes.

Further, an orthographic projection of the first groove 103a and the second groove 103b formed by one LED chip 30 on the driving substrate 10 and orthographic projections of the first binding point 101 and the second binding point 102 on the driving substrate 10 are at least partially non-overlapping. This can effectively ensure the arrangement of the groove and the arrangement of the first via hole 103c and the second via hole 103d, preventing the first pin 302 and the second pin 303 from puncturing the compensation layer 103 and from damaging the first binding point 101 and the second binding point 102.

Figure 7:
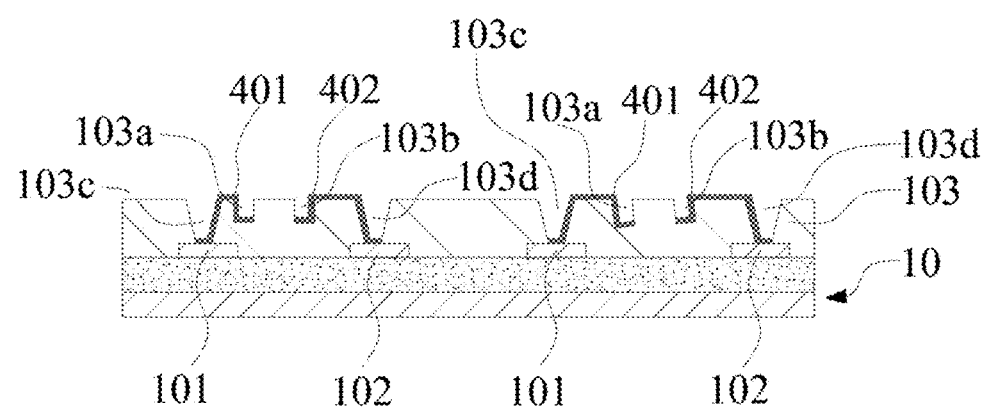
FIG. 7 shows a structural schematic diagram of adding a first transfer electrode and a second transfer electrode on the compensation layer according to embodiment 1 of the present disclosure.

Step S600, as shown in FIG. 7, a first transfer electrode 401 and a second transfer electrode 402 disconnected from each other are formed on the compensation layer 103. The first transfer electrode 401 has a portion located in the first groove 103a and a portion overlapped with the first binding point 101 through the first via hole 103c. The second transfer electrode 402 has a portion located in the second groove 103b and a portion overlapped with the second binding point 102 through the second via hole 103d.

For example, a film is formed on the compensation layer 103, which is exposed, developed, and etched to form the first transfer electrode 401 and the second transfer electrode 402 spaced apart from each other. The first transfer electrode 401 has a portion located in the first groove 103a, a portion overlapped with the first binding point 101 through the first via hole 103c, and the rest is located on the compensation layer 103. The second transfer electrode 402 has a portion located in the second groove 103b and a portion overlapped with the second binding point 102 through the second via hole 103d, and the rest is located on the compensation layer

103. It can be understood that the first transfer electrode 401 and the second transfer electrode 402 located on the compensation layer 103 are disposed at intervals from each other.

Optionally, a film is formed on the compensation layer 103 by physical vapor deposition (PVD), and the first and second transfer electrodes 401 and 402 are formed by photolithography. The first transfer electrode 401 flows into the first via hole 103c to be overlapped with the first binding point 101, and the first transfer electrode 401 flows into the second via hole 103d to be connected to the second binding point 102 to supply a positive voltage and a negative voltage to the LED chip 30, respectively.

The first transfer electrode 401 and the second transfer electrode 402 may be made of indium tin oxide (ITO), indium gallium zinc oxide (IGZO) or the like, and are not specifically limited.

Figure 8:
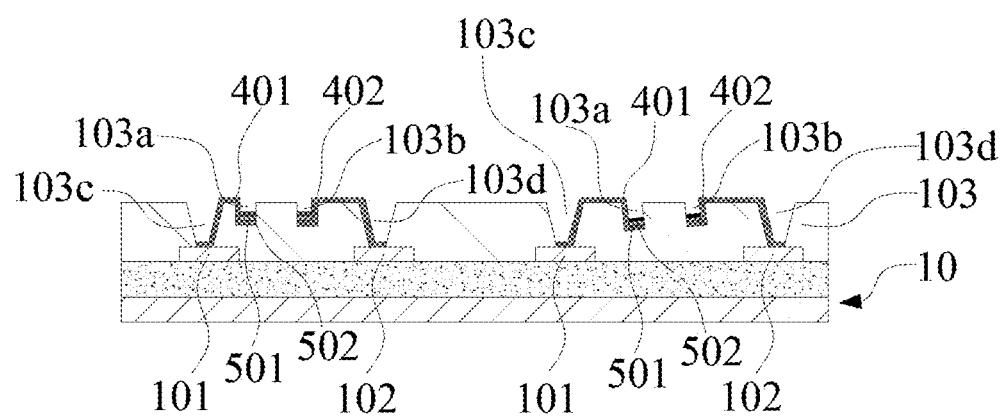
FIG. 8 shows a structural schematic diagram of an under bump metal and In/Sn points provided in the groove according to embodiment 1 of the present disclosure.
Figure 9:
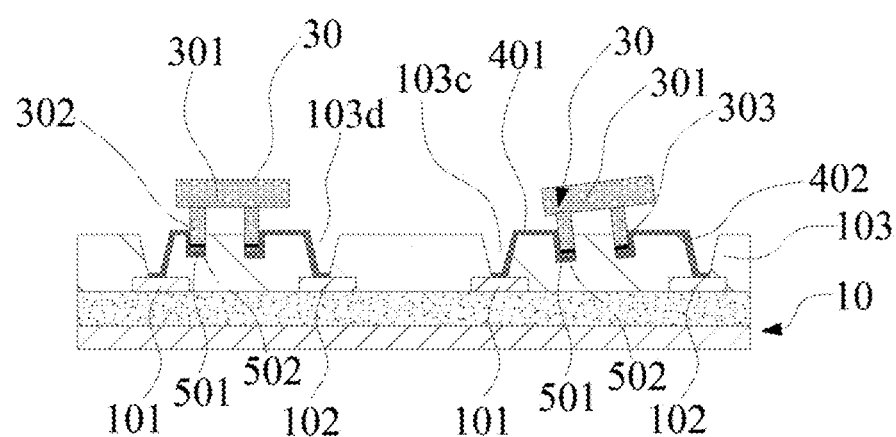
FIG. 9 shows a structural schematic diagram of the binding of the chip and In/Sn point according to embodiment 1 or embodiment 2 of the present disclosure.

In step S700, referring to FIGS. 1, 8, and 9, the chip substrate and the driving substrate 10 are subjected to a second alignment process such that the first pin 302 is inserted into the first groove 103a and bound to the first transfer electrode 401, and the second pin 303 is inserted into the second groove 103b and bound to the second transfer electrode 402.

In this way, the first pin 302 of the LED chip 30 can be connected to the first binding point 101 through the first transfer electrode 401, and the second pin 303 can be connected to the second binding point 102 through the second transfer electrode 402 to supply the positive voltage and the negative voltage to the LED chip 30.

It can be understood that in the present disclosure, the compensation layer 103 is added on the driving substrate 10, the first pin 302 and the second pin 303 on the chip substrate are laminated on the compensation layer 103, the first groove 103a and the second groove 103b with the same profiles as the first pin 302 and the second pin 303 are formed on the compensation layer 103, and the first pin 302 and the second pin 303 are connected to the first binding point 101 and the second binding point 102, respectively, through the first transfer electrode 401 and the second transfer electrode 402. In this way, the problem of abnormal binding caused by different horizontal heights or inclination of the LED chips 30 adhered to the chip substrate can be solved, and the transfer accuracy between the LED chips and the driving substrate 10 can be improved, and the connection tightness between the pins of the LED chips 30 and the binding points can be improved.

Further, forming the compensation layer 103 covering the first binding point 101 and the second binding point 102 on the driving substrate 10 may include the following steps:

forming a curable material on the driving substrate 10; and performing a pre-curing treatment on the curable material to form the compensating layer 103.

For example, the compensation layer 103 may be made of an organic material such as Polyimide (PI), and Polymethyl Methacrylate (PMMA). The organic material is baked at a temperature of 60° C. to 90° C. for 50 s to 90 s in a vacuum environment, so that the solvent in most of the organic material volatilizes, the organic material changes from a liquid state to a semi-solid state, and the compensation layer 103 remains soft and can be deformed. That is, the compensation layer 103 is pre-cured so that the first groove 103a and the second groove 103b having the same profiles as the first pin 302 and the second pin 303 can be effectively formed on the compensation layer 103.

Alternatively, the organic material can be baked at a temperature of 60° C. for 90 s in the vacuum environment to volatilize most of the solvent in the organic material and change the organic material from liquid to semi-solid.

Alternatively, the organic material is baked at a temperature of 70° C. for 70 s in the vacuum environment to volatilize most of the solvents in the organic material and change the organic material from liquid to semi-solid.

Alternatively, the organic material is baked at a temperature of 90° C. for 50 s in the vacuum environment to volatilize most of the solvent in the organic material and change the organic material from liquid to semi-solid.

In order to improve the stability of the compensation layer 103, after applying an external pressure toward the driving substrate 10 to the chip substrate and before performing a patterning process on the compensation layer 103, the transfer method further includes:

After detaching the first pin 302 and the second pin 303 from the compensation layer 103, the compensation layer 103 is cured. The hardness of the compensation layer 103 after the curing treatment is greater than that of the compensation layer 103 after the pre-curing treatment.

It can be understood that the first pin 302 and the second pin 303 are detached from the compensation layer 103 by separating the chip substrate with the LED chip 30 from the driving substrate 10, and then curing the compensation layer 103 having the first groove 103a and the second groove 103b.

For example, the semi-solid compensation layer 103 is baked and cured at 180° C. to 250° C. for 20 min to 30 min to cure the compensation layer 103 so that the groove is shaped and the groove collapse is prevented from affecting the insertion of pins of the LED chips 30.

Alternatively, the semi-solid compensation layer 103 is baked at a temperature of 180° C. for 30 min to solidify the compensation layer 103.

Alternatively, the semi-solid compensation layer 103 is baked at a temperature of 200° C. for 25 min to solidify the compensation layer 103.

Alternatively, the semi-solid compensation layer 103 is baked at 250° C. for 20 min to solidify the compensation layer 103.

It should be noted that the compensation layer 103 can be contracted in a heated state, so that the actual widths of the first groove 103a and the second groove 103b formed on the compensation layer 103 are larger than the widths of the first pin 302 and the second pin 303, so that the first pin 302 and the second pin 303 are more smoothly and conveniently inserted again, and pins of the LED chips 30 are not easily damaged.

Further, as shown in FIGS. 8 and 9, after the first switch electrode 401 and the second switch electrode 402 disconnected from each other are formed on the compensation layer 103 and before the chip substrate and the driving substrate 10 are subjected to a second alignment process, the transfer method further includes forming a solder layer in the first groove 103a and the second groove 103b.

It should be noted that the first pin 302 and the second pin 303 are soldered together with the first switch electrode 401 and the second switch electrode 402 through the solder layer. Meanwhile, since the first transfer electrode 401 is connected to the first binding point 101 and the second transfer electrode 402 is connected to the second binding point 102, the pins of the LED chips 30 are connected to the first binding point 101 and the second binding point 102, respectively, to receive the positive voltage and the negative voltage supplied by the first binding point 101 and the second binding point 102.

For example, an under bump metal (UBM) 501 is formed by evaporation and photolithography in the first groove 103a and the second groove 103b of the compensation layer 103, and then an In/Sn point 502 is formed on the under bump metal (UBM) 501 for binding the first pin 302 and the second pin 303 to the first transfer electrode 401 and the second transfer electrode 402.

It can be understood that since the under bump metal (UBM) 501 and the In/Sn point 502 formed in the first groove 103a and the second groove 103b are the same as the inclined positions and horizontal heights of the first pin 302 and the second pin 303 on the chip substrate. In this way, by fitting each other, the binding effect of the first pin 302 and the second pin 303 with the first binding point 101 and the second binding point 102 can be improved, the transfer success rate of the LED chip 30 can be improved, and the effective binding of the pins of the LED chips 30 with the driving substrate 10 can be ensured, thereby ensuring that the LED chip 30 emits light normally.

Further, as shown in FIG. 9, after the chip substrate and the driving substrate 10 are subjected to a second alignment process such that the first pin 302 and the second pin 303 are inserted into the first groove 103a and the second groove 103b, respectively, the transfer method further includes sequentially performing a melting process and a cooling and curing process on the solder layers in the first groove 103a and the second groove 103b so that the first pin 302 and the second pin 303 are bound to the first transfer electrode 401 and the second transfer electrode 402, respectively.

For example, when the first pin 302 and the second pin 303 are inserted into the groove, the In/Sn point 502 is also heated and melted, and then cooled and solidified, so that the In/Sn point 502 in the first groove 103a is welded with the first pin 302 and the In/Sn point 502 in the second groove 103b is welded with the second pin 303. Since the fixing force between the In/Sn point 502 and the pin of the LED chip 30 is greater than the adhesion force between the chip substrate and the LED chip 30, the chip substrate is separated from the LED chip 30, and the transfer of the LED chip 30 is completed.

It should be noted that the solder layers in the first groove 103a and the second groove 103b may be melted by heating and melting in sequence by inserting the first pin 302 and the second pin 303 into the first groove 103a and the second groove 103b, and may be soldered to the first pin 302 and the second pin 303 without specific limitation.

It is worth mentioning that heating and melting can reach the melting point of In/Sn, such as 260° C. and 270° C., etc.

In addition, the compensation layer 103 in the embodiment of the present disclosure is made of Polyimide (PI) and polymethyl methacrylate (PMMA), which can effectively prevent decomposition or deformation of the compensation layer 103 when In/Sn is melted. Of course, other organic materials having good thermal stability may be used for the compensation layer 103, which are not specifically limited.

In step S800, as shown in FIGS. 1 and 9, the substrate 201 is stripped from the LED chip 30 after the second alignment process between the chip substrate and the driving substrate 10.

It can be understood that when the first pin 302 and the second pin 303 are soldered to the solder layer respectively, the substrate 201 is removed, which makes the separation of the substrate 201 and the LED chip 30 easier.

Embodiment 2

Embodiment 2 of the present disclosure provides a display panel which, as shown in FIG. 9, includes a driving substrate 10, an LED chip 30, a first transfer electrode 401, a second transfer electrode 402, and a compensation layer 103.

The driving substrate 10 has at least one set of binding points, and one set of binding points includes a first binding point 101 and a second binding point 102. The first binding point 101 may be a drain in a transistor, and the second binding point 102 may be a common signal line arranged in the same layer as the drain.

The LED chip 30 includes a chip body 301, a first pin 302 and a second pin 303. The first pin 302 and the second pin 303 are connected to the chip body 301 and disposed at intervals.

A compensation layer 103 is provided on the driving substrate 10 and covers the first binding point 101 and the second binding point 102. The compensation layer 103 is provided with a first groove 103a and a second groove 103b arranged at intervals.

The first transfer electrode 401 has a portion connected to the first binding point 101 through the first via hole 103c and a portion located in the first groove 103a, and the rest of which is located on the compensation layer 103.

The second transfer electrode 402 has a portion connected to the second binding point 102 through the second via hole 103d and a portion located in the second groove 103b, and the rest of which is located on the compensation layer 103.

It can be understood that the compensation layer 103 is provided with the first groove 103a and the second groove 103b fitting with first pin 302 and second pin 303, and when the first pin 302 and the second pin 303 are inserted into the first groove 103a and second groove 103b, the first pin 302 and second pin 303 are connected to the first binding point 101 and the second binding point 102 through the first transfer electrode 401 and the second transfer electrode 402, respectively, so as to supply positive and negative voltages to the LED chip 30 so that the LED chip 30 is displayed normally.

Thus, a transfer electrode and a solder point are added in the first groove 103a and the second groove 103b having the same profiles as the first pin 302 and the second pin 303 so that the first pin 302 and the second pin 303 are stably connected to the first binding point 101 and the second binding point 102, thus ensuring the tight connection between the first pin 302 and the second pin 303 and the first binding point 101 and the second binding point 102, effectively solving the problems of transfer accuracy and abnormal binding between the LED chip 30 and the driving substrate 10, and further improving the display effect of the display panel.

Further, as shown in FIG. 9, the thickness of the compensation layer 103 should be higher than the thicknesses of the first pin 302 and the second pin 303. Thus, the LED chip 30 can be effectively protected and the LED chip 30 can be prevented from being inserted too deeply to cause damage to the transistor.

Further, as shown in FIG. 9, the orthographic projections of the first and second binding points 101 and 102 on the driving substrate 10 and the orthographic projections of the first and second pin 302 and 303 on the driving substrate 10 are at least partially non-overlapping. In this way, the arrangement of the first groove 103a and the second groove 103b as well as the first via hole 103c and the second via hole 103d is not affected, and the damage, caused by the piercing of the first pin 302 and the second pin 303, to the first binding point 101 and the second binding point 102 can be avoided.

In addition, an under bump metal (UBM) 501 and an In/Sn point 502 are both provided in each of the first groove 103a and the second groove 103b formed on the compensation layer 103 having the same profiles as the first pin 302 and the second pin 303. The In/Sn point 502 is welded together with the first pin 302 or the second pin 303 and then connected to the first switch electrode 401 or the second switch electrode 402 through the under bump metal (UBM) 501.

It is worth mentioning that the horizontal heights and inclination angles of the under bump metal (UBM) 501 and the In/Sn point 502 located in the first groove 103a and the second groove 103b are the same as those of the first pin 302 and the second pin 303, so as to ensure the connection accuracy between the first pin 302, the second pin 303 and the first switch electrode 401, the second switch electrode 402, ensure the light emission of the LED chip 30, and further ensure the display effect of the display panel.

In the content of the description, illustrations of the reference terms "some embodiments," "example," etc. mean that specific features, structures, materials, or characteristics described in connection with the embodiment or example are encompassed in at least one embodiment or example of the present disclosure. In this description, the schematic formulation of the above terms need not be directed to the same embodiments or examples. Further, the specific features, structures, materials or characteristics described may be combined in a suitable manner in any one or more embodiments or examples. Further, without contradicting one another, those skilled in the art may connect and combine different embodiments or examples described in this description and features of different embodiments or examples.

Although embodiments of the present disclosure have been shown and described above, it will be understood that the above-mentioned embodiments are exemplary and cannot be construed as limiting the present disclosure. Those of ordinary skill in the art may make changes, variations, alternatives and modifications to the above-mentioned embodiments within the scope of the present disclosure. Therefore, any changes or modifications made in accordance with the claims and descriptions of the present disclosure should fall within the scope of the patent of the present disclosure.

What is claimed is:

1. An LED chip transfer method, comprising:
providing a driving substrate having at least one set of binding points, the at least one set of binding points comprising a first binding point and a second binding point;
forming a compensation layer covering the first binding point and the second binding point on the driving substrate;
providing a chip substrate comprising a substrate and a plurality of chips, each of the plurality of chips comprising a chip body, a first pin and a second pin, the first pin and the second pin being disposed on a side of the chip body away from the substrate;
performing first alignment processing between the chip substrate and the driving substrate, forming a first groove in the compensation layer by using the first pin, and forming a second groove in the compensation layer by using the second pin, the second groove being spaced from the first groove, the first groove and the second groove having the same profiles as the first pin and the second pin;
patterning the compensation layer after the first groove and the second groove are formed in the compensation, forming a first via hole and a second via hole spaced from each other by the first groove and the second groove in the compensation layer, the first via hole exposing at least a portion of the first binding point, and the second via hole exposing at least a portion of the second binding point;
forming a first transfer electrode and a second transfer electrode disconnected from each other on the compensation layer, the first transfer electrode coated on surfaces of the first via hole and the first groove, the first transfer electrode having a portion located in the first groove and a portion overlapped with the first binding point through the first via hole, the second transfer electrode coated on surfaces of a second via hole and the second groove, the second transfer electrode having a portion located in the second groove and a portion overlapped with the second binding point through the second via hole;
performing a second alignment process between the chip substrate and the driving substrate, so that the first pin is inserted into the first groove and bound with the portion of the first transfer electrode in the first groove, and the second pin is inserted into the second groove and bound with the portion of the second transfer electrode in the second groove, wherein an orthographic projection of the first binding point and the second binding point on the driving substrate is at least partially non-overlapping with an orthographic projection of the first pin and the second pin on the driving substrate; and wherein the first groove and the second groove are located between the first via hole and the second via hole; and
stripping the substrate from the chip after the second alignment process is performed between the chip substrate and the driving substrate.

2. The LED chip transfer method according to claim 1, wherein forming the first groove on the compensation layer by using the first pin and forming the second groove on the compensation layer by using the second pin comprises:
applying an external pressure toward the driving substrate to the chip substrate to press at least a portion of the first pin and the second pin into the compensation layer after the first alignment process is performed between the chip substrate and the driving substrate, and forming the first groove and the second groove.

3. The LED chip transfer method according to claim 2, wherein after applying an external pressure toward the driving substrate to the chip substrate, a portion of each of the first pin and the second pin is pressed into the compensation layer, and another portion of each of the first pin and the second pin is protruded away from a surface of the driving substrate relative to the compensation layer.

4. The LED chip transfer method according to claim 2, wherein forming the compensation layer covering the first binding point and the second binding point on the driving substrate comprises:
forming a curable material on the driving substrate; and
performing a pre-curing treatment on the curable material to form the compensating layer.

5. The LED chip transfer method according to claim 4, wherein after applying the external pressure toward the driving substrate to the chip substrate and prior to patterning the compensation layer, the transfer method further comprises:

performing a curing treatment on the compensation layer after detaching the first pin and the second pin from the compensation layer; wherein a hardness of the compensation layer after the curing treatment is greater than a hardness of the compensation layer after the pre-curing treatment.

6. The LED chip transfer method according to claim 5, wherein the curable material is polyimide or polymethyl methacrylate; wherein the pre-curing treatment and the curing treatment are baking treatments, and a baking temperature of the pre-curing treatment is lower than a baking temperature of the curing treatment.

7. The LED chip transfer method according to claim 6, wherein performing the pre-curing treatment on the curable material to form the compensating layer comprises:

baking the curable material at a temperature of 60° C. to 90° ° C. for 50 s to 90 s in a vacuum environment to make the curable material change from a liquid state to a semi-solid state.

8. The LED chip transfer method according to claim 6, wherein performing the pre-curing treatment on the curable material to form the compensating layer comprises:

baking the curable material at a temperature of 70° C. for 70 s in a vacuum environment to make the curable material change from a liquid state to a semi-solid state.

9. The LED chip transfer method according to claim 6, wherein performing the curing treatment on the compensation layer comprises:

baking and curing the semi-solid compensation layer at 180° C. to 250° C. for 20 min to 30 min to shape the first groove and the second groove.

10. The LED chip transfer method according to claim 6, wherein performing the curing treatment on the compensation layer comprises:

baking and curing the semi-solid compensation layer at 200° C. for 25 min to shape the first groove and the second groove.

11. The LED chip transfer method according to claim 6, wherein widths of the first groove and the second groove formed on the compensation layer are larger than the widths of the first pin and the second pin after the compensation layer is heated.

12. The LED chip transfer method according to claim 1, wherein after forming a first transfer electrode and a second transfer electrode disconnected from each other on the compensation layer and prior to performing the second alignment process between the chip substrate and the driving substrate, the transfer method further comprises:

forming solder layers in the first groove and the second groove; and after performing a second alignment process between the chip substrate and the driving substrate, so that the first pin is inserted into the first groove and bound with the first transfer electrode, and the second pin is inserted into the second groove and bound with the second transfer electrode, the transfer method further comprises: performing a melting treatment and a cooling and curing treatment in turn on the solder layers in the first groove and the second groove, so that the first pin and the second pin are respectively bound with the first transfer electrode and the second transfer electrode.

13. The LED chip transfer method according to claim 1, wherein the first binding point and the second binding point are arranged in a same layer.

14. The LED chip transfer method according to claim 1, wherein a thickness of the compensation layer is 2 to 4 μm.

15. The LED chip transfer method according to claim 1, wherein the compensation layer is formed by physical vapor deposition.

16. A display panel comprising:

a driving substrate having at least one set of binding points, the at least one set of binding points comprising a first binding point and a second binding point;

a chip comprising a chip body, a first pin and a second pin, the first pin and the second pin being connected to the chip body and arranged at intervals;

a compensation layer arranged on the driving substrate and covering the first binding point and the second binding point, the compensation layer being provided with a first groove and a second groove arranged at intervals, and the first groove and the second groove having the same profiles as the first pin and the second pin;

a first transfer electrode coated on surfaces of a first via hole and the first groove, the first transfer electrode having a portion connected to the first binding point through the first via hole and a portion located in the first groove; and a second transfer electrode arranged on the compensation layer and spaced from the first transfer electrode coated on surfaces of a second via hole and the second groove, the second transfer electrode having a portion connected to the second binding point through the second via hole, and a portion located in the second groove;

wherein the first pin is disposed in the first groove and bounded to the portion of the first transfer electrode in the first groove, and the second pin is disposed in the second groove and bounded to the portion of the second transfer electrode in the second groove, wherein the first pin and the second pin are between the chip body and driving substrate;

wherein an orthographic projection of the first binding point and the second binding point on the driving substrate is at least partially non-overlapping with an orthographic projection of the first pin and the second pin on the driving substrate; and wherein the first groove and the second groove are located between the first via hole and the second via hole.

17. The display panel according to claim 16, wherein thicknesses of the first pin and the second pin are the same, and a thickness of the compensation layer is higher than the thicknesses of the first pin and the second pin.

18. The display panel according to claim 16, wherein a thickness of the compensation layer is 2 to 4 μm.

* * * * *